United States Patent [19]
Abramovici et al.

[11] Patent Number: 6,108,806
[45] Date of Patent: *Aug. 22, 2000

[54] METHOD OF TESTING AND DIAGNOSING FIELD PROGRAMMABLE GATE ARRAYS

[75] Inventors: Miron Abramovici, Berkeley Heights, N.J.; Eric Seng-Kar Lee, Allentown, Pa.; Charles Eugene Stroud, Lexington, Ky.

[73] Assignees: Lucent Technologies Inc., Murray Hill, N.J.; University of Kentucky Research Foundation, Lexington, Ky.

[*] Notice: This patent is subject to a terminal disclaimer.

[21] Appl. No.: 09/059,552

[22] Filed: Apr. 13, 1998

Related U.S. Application Data

[63] Continuation-in-part of application No. 08/729,117, Oct. 11, 1996, Pat. No. 5,991,907, which is a continuation-in-part of application No. 08/595,729, Feb. 2, 1996, abandoned, which is a continuation-in-part of application No. 08/974,799, Nov. 20, 1997, Pat. No. 6,003,150, which is a continuation of application No. 08/595,729, Feb. 2, 1996, abandoned.

[51] Int. Cl.⁷ ............................................. G01R 31/28
[52] U.S. Cl. ............................. 714/725; 395/500.17
[58] Field of Search ............................. 714/724, 725, 714/737, 733, 736; 326/10, 38, 40, 28; 395/500.02, 500.05, 500.17, 500.18, 500.34, 500.36

[56] References Cited

U.S. PATENT DOCUMENTS

| | | | |
|---|---|---|---|
| Re. 34,445 | 11/1993 | Hayes et al. | 371/21.1 |
| 4,414,669 | 11/1983 | Heckelman et al. | 371/49 |
| 4,757,503 | 7/1988 | Hayes et al. | 371/21 |
| 4,817,093 | 3/1989 | Jacobs et al. | 371/25 |
| 5,051,996 | 9/1991 | Bergeson et al. | 371/22.4 |
| 5,081,297 | 1/1992 | Lebel et al. | 395/325 |
| 5,090,015 | 2/1992 | Dabbish et al. | 371/22.5 |
| 5,107,208 | 4/1992 | Lee | 324/158 R |
| 5,179,561 | 1/1993 | Izawa et al. | 371/52 |
| 5,260,946 | 11/1993 | Nunally | 714/724 |
| 5,278,841 | 1/1994 | Myers | 371/20.6 |
| 5,347,519 | 9/1994 | Cooke et al. | 371/22.1 |
| 5,361,264 | 11/1994 | Lewis | 714/733 |
| 5,425,036 | 6/1995 | Lie et al. | 371/23 |
| 5,430,734 | 7/1995 | Gilson | 714/725 |
| 5,475,624 | 12/1995 | West | 395/500.36 |
| 5,488,612 | 1/1996 | Heybruck | 714/725 |
| 5,508,636 | 4/1996 | Mange et al. | 714/725 |
| 5,623,501 | 4/1997 | Cooke et al. | 371/22.2 |

OTHER PUBLICATIONS

Stroud et al.; Using ILA Testing for Bist in FPGAs; Intern. Test Conference; Oct. 20, 1996.
Stroud et al.; Bist–Based Diagnostics of FPGA Logic Blocks; International Test Conference; Nov. 3, 1997.

*Primary Examiner*—Emmanuel L. Moise
*Attorney, Agent, or Firm*—King and Schickli, PLLC

[57] ABSTRACT

A method of testing field programmable gate arrays (FPGAs) includes establishing a first group of programmable logic blocks as test pattern generators or output response analyzers and a second group of programmable logic blocks as blocks under test. This is followed by generating test patterns and comparing outputs of two blocks under test with one output response analyzer. Next is the combining of results of a plurality of output response analyzers utilizing an iterative comparator in order to produce a pass/fail indication. The method also includes the step of reconfiguring each block under test so that each block under test is tested in all possible modes of operation. Further, there follows the step of reversing programming of the groups of programmable logic blocks so that each programmable logic block is configured at least once as a block under test.

15 Claims, 6 Drawing Sheets a) N=8 b) N=10 c) N=12 d) N=14

FIG. 7A

DIAGNOSTIC SESSION WE

BIST SESSION NS / BIST SESSION SN

DIAGNOSTIC SESSION EW

FIG. 7B

DIAGNOSTIC SESSION WE

BIST SESSION NS / BIST SESSION SN

DIAGNOSTIC SESSION EW

FIG. 8

CONFIGURING THE PLBs OF AN FPGA FOR COMPLETING A BUILT-IN SELF-TEST BY CONFIGURING/ESTABLISHING A FIRST GROUP OF PLBs TO INCLUDE AT LEAST ONE AND MORE PREFERABLY TWO TEST PATTERN GENERATORS AND AT LEAST TWO OUTPUT RESPONSE ANALYZERS AND A SECOND GROUP OF PLBs TO INCLUDE A PLURALITY OF BLOCKS UNDER TEST

↓

INITIATING THE BUILT-IN SELF-TEST BY GENERATING TEST PATTERNS WITH THE TEST PATTERN GENERATORS INCLUDING COMMUNICATING TEST PATTERNS GENERATED BY A FIRST OF THE TEST PATTERN GENERATORS TO A FIRST GROUP OF BLOCKS UNDER TEST AND COMMUNICATING TEST PATTERNS GENERATED BY A SECOND OF THE TEST PATTERN GENERATORS TO A SECOND GROUP OF BLOCKS UNDER TEST

↓

REPEATEDLY RECONFIGURING EACH BLOCK UNDER TEST TO TEST EACH COMPLETELY IN ALL MODES OF OPERATION

↓

COMMUNICATING OUTPUTS FROM TWO BLOCKS UNDER TEST TO ONE OF THE OUTPUT RESPONSE ANALYZERS

↓

ANALYZING THE OUTPUTS FROM THE BLOCKS UNDER TEST TO PRODUCE A PASS/FAIL INDICATION BY COMPARING THE OUTPUTS OF THE BLOCKS UNDER TEST AND COMBINING RESULTS FROM A PLURALITY OF THE OUTPUT RESPONSE ANALYZERS UTILIZING AN ITERATIVE COMPARATOR

METHOD OF TESTING AND DIAGNOSING FIELD PROGRAMMABLE GATE ARRAYS

This application is a continuation-in-part of (a) U.S. application Ser. No. 08/729,117, filed Oct. 11, 1996, U.S. Pat. No. 5,991,907, a continuation-in-part of U.S. application Ser. No. 08/595,729, filed Feb. 2, 1996, abandoned, and (b) U.S. application Ser. No. 08/974,799, filed Nov. 20, 1997, U.S. Pat. No. 6,003,150, a continuation of U.S. application Ser. No. 08/595,729, filed Feb. 2, 1996, abandoned.

TECHNICAL FIELD

The present invention relates generally to the field of testing of integrated circuit devices and, more particularly, to a method of diagnostic testing applicable to field programmable gate arrays.

BACKGROUND OF THE INVENTION

A field programmable gate array (FPGA) is a type of integrated circuit consisting of an array of programmable logic blocks (PLBs) interconnected by programmable routing resources and programmable I/O cells. Programming of these logic blocks, routing resources and I/O cells is selectively completed to make the necessary interconnections that establish a configuration thereof to provide desired system operation/function for a particular circuit application.

As is well known, it is desirable to complete diagnostic testing of all types of integrated circuits including FPGAs. Toward this end, the present inventors have recently developed two methods of built-in self-testing for FPGAs. These methods are set out in detail in U.S. Pat. No. 5,991,907 and U.S. Pat. No. 6,003,150 referenced above. The full disclosures in these patent applications are incorporated herein by reference.

In each of these methods, the reprogramability of an FPGA is exploited so that the FPGA is configured exclusively with built-in self-test logic during the testing. In this way, testability is achieved without overhead. The built-in self-test logic simply "disappears" when the circuit is reconfigured for its normal operation. The only cost for these testing methods is the additional memory for storing the data required for reconfiguring the FPGA but this may be made a part of the test machine environment e.g. automatic testing equipment (ATE), central processing unit (CPU) or maintenance processor not involving FPGA resources.

While both of these earlier methods provide reliable diagnostic testing, they could be improved upon. The first test method, disclosed in U.S. Pat. No. 6,003,150, utilizes significant amounts of global routing. The second test method, disclosed in U.S. Pat. No. 5,991,907 utilizes an iterative logic array (ILA) architecture where most signals can be routed locally. However, the test time is approximately 33% longer than the first method.

SUMMARY OF THE INVENTION

The built-in self-testing of FPGAs is improved, in accordance with one aspect of the invention, by providing a new, hybrid method that utilizes only a very limited amount of global routing to provide complete diagnostic testing of an FPGA in substantially the same time frame as the earlier method described in U.S. Pat. No. 6,003,150. In accordance with another aspect of the invention a plurality of defective programmable logic blocks may be accurately located at the intersection of failing rows and columns of the FPGA. Failed, individual programmable logic blocks may be readily identified by means of a 90° re-orientation diagnostic approach.

In accordance with the principles of the present invention a method of testing an FPGA includes the step of configuring a first group of programmable logic blocks to include at least one test pattern generator and at least two output response analyzers. Next is the designating of a second group of programmable logic blocks as a plurality of blocks under test. This is followed by the steps of generating test patterns with the test pattern generators, comparing outputs of two of the blocks under test with one of the output response analyzers and combining results of a plurality of the output response analyzers utilizing an iterative comparator in order to produce a pass/fail indication.

In accordance with further aspects of the present invention, the method also includes repeatedly reconfiguring each of the blocks under test in order to test each of the blocks under test completely in all possible modes of operation. Additionally, the method includes the step of exchanging functional roles of the first and second groups of programmable logic blocks so that the first group is designated as a plurality of blocks under test and the second group is configured as at least one test pattern generator and at least two output response analyzers. Still further, the method includes repeatedly reconfiguring each of the new blocks under test in order to test each completely in all modes of operation.

Stated another way, the present method includes the configuring of the programmable logic blocks for completing a built-in self-test by establishing a first group of programmable logic blocks as at least two separate test pattern generators and at least two output response analyzers and establishing a second group of the programmable logic blocks as a plurality of blocks under test. This is then followed by the generating of test patterns with the two separate test pattern generators. Next is the communicating of the test patterns generated by the first of the test pattern generators to a first group of blocks under test and then communicating of the test patterns generated by the second of the test pattern generators to a second group of blocks under test. Next is the communicating of the outputs from the first and second blocks under test to one of the output response analyzers and the analyzing of the outputs from the blocks under test in order to produce a pass/fail indication.

The method may also be further define to include the repeated reconfiguring of each block under test in order to test each of the blocks under test completely and in all possible modes of operation. Further, the method may include the exchanging of the functional roles of the first and second groups of the programmable logic blocks so that the first group of programmable logic blocks are established as a plurality of blocks under test and the second group of programmable logic blocks are established as at least two separate test pattern generators and at least two output response analyzers. Once recongifured, the new blocks under test are reconfigured in order to test each completely in all possible modes of operation. Further, it is preferred that the analyzing is performed by iterative comparing of the outputs from the first and second groups of blocks under test.

In accordance with yet another aspect of the present invention, the method of testing an FPGA may be defined as selectively configuring the programmable logic blocks as test pattern generators, output response analyzers and blocks under test for completion of a built-in self test. This is followed by the communicating of test patterns generated by the test pattern generators to the blocks under test by global routing and the communicating of the outputs of the blocks under test to the output response analyzers by local routing. This is followed by the analyzing of the outputs by iterative comparison in order to produce a pass/fail indication.

Still further, the method of the present invention provides for the testing an N×N FPGA including a plurality of programmable logic blocks in N rows and N columns. The method includes the configuring of a first group of rows of the programmable logic blocks as at least one test pattern generator and at least two output response analyzers. Next is the establishing of a second group of rows of programmable logic blocks as a plurality of blocks under test. This is followed by the generating of test patterns with the test pattern generators. Next is comparing outputs of the blocks under test with the output response analyzers using failing test results to identify a faulty row or a plurality of faulty rows. This is followed by the exchanging of the functional roles of the rows of programmable logic blocks and the configuring of a third group of columns of the programmable logic blocks as at least one test pattern generator and at least two output response analyzers. Next is the establishing of a fourth group of columns of the programmable logic blocks as a plurality of blocks under test. This is followed by the generating of test patterns with the test pattern generators and the comparing of outputs of the blocks under test with the output response analyzers. Then comes the exchanging of the functional roles of the columns of programmable logic blocks and the using of the failing test results to identify a faulty column or a plurality of faulty columns. This is followed by the combining of the identified faulty rows with the identified faulty columns to identify individual faulty programmable logic blocks. Preferably, each of the blocks under test is repeatedly reconfigured in order to test each completely and in all possible modes of operation.

In accordance with yet another aspect of the present invention an FPGA is configured to include a test pattern generator, at least two output response analyzers, a plurality of blocks under test and an iterative comparator for comparing outputs of two of the blocks under test with each output response analyzer and combining results of those output response analyzers in order to produce a pass/fail indication. The FPGA further includes a memory for storing test patterns and configurations as necessary to provide exhaustive testing of each block under test. Advantageously this is accomplished without any system overhead as the FPGA does not include any dedicated circuitry for built-in self-testing applications.

BRIEF DESCRIPTION OF THE DRAWING

The accompanying drawing incorporated in and forming a part of the specification, illustrates several aspects of the present invention and together with the description serves to explain the principles of the invention. In the drawing:

FIGS. 7a–7b graphically illustrate the results of built-in self-test based diagnostic sessions for two faulty ORCA 2C15A devices; and FIGS. 8 and 8a when considered in combination represent a schematical block diagram of the present method.

Reference will now be made in detail to the present preferred embodiment of the invention, an example of which is illustrated in the accompanying drawing.

DETAILED DESCRIPTION OF THE INVENTION

Figure 8A:
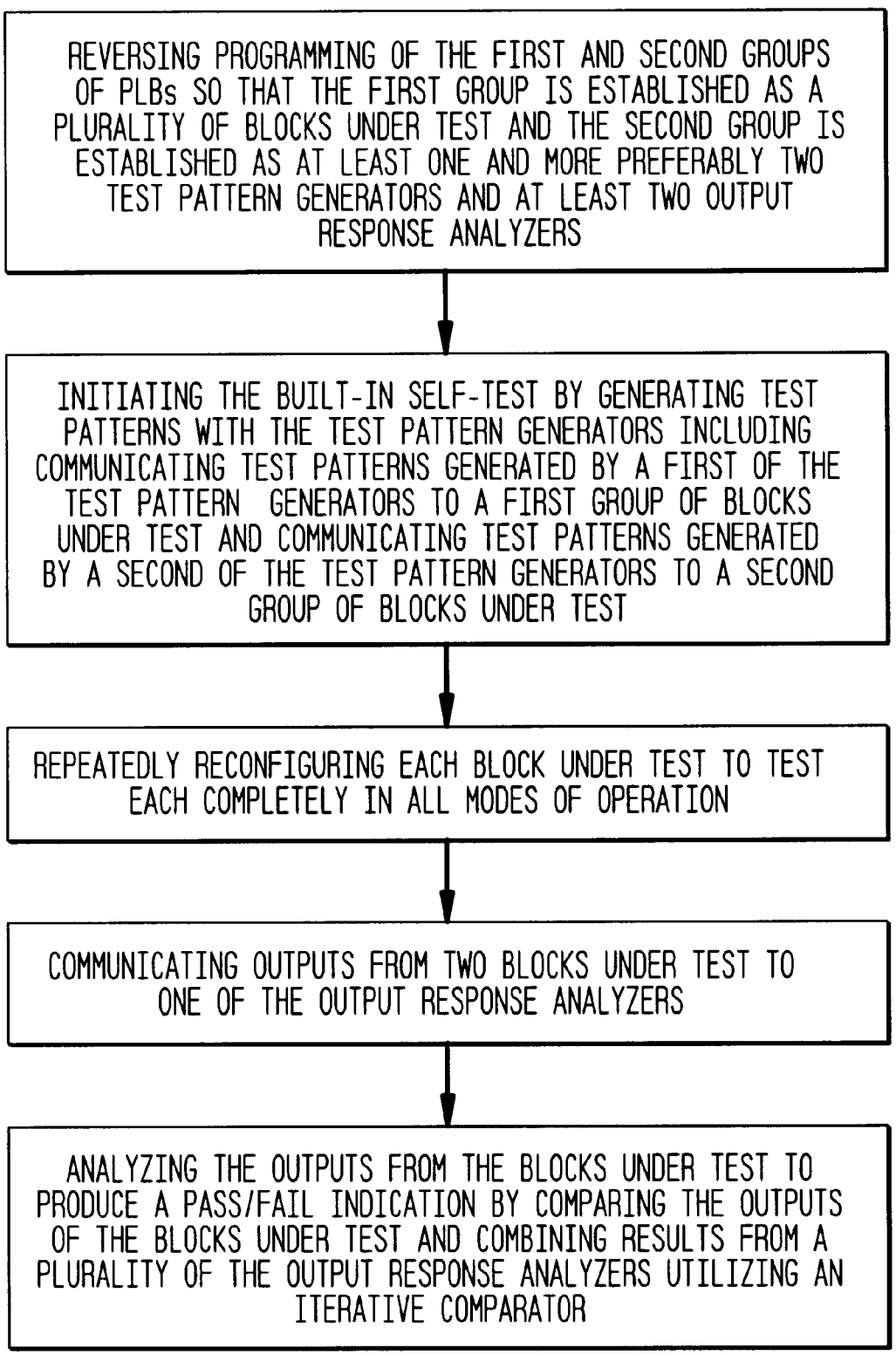

The method of the present invention for diagnostic testing of FPGAs will now be described in detail. The method comprises a sequence of test phases with each phase consisting of a series of simple steps (see FIGS. 8 and 8a). The first of these steps is the configuring of the programmable logic blocks (PLBs) of an FPGA for completing a built-in self-test (BIST). This is accomplished by configuring/establishing/designating a first group of PLBs to include at least one test pattern generator or output response analyzer and a second group of PLBs to include a plurality of blocks under test (BUT). Preferably, two separate test pattern generators are established.

Next is the initiating of the BIST by generating test patterns with the test pattern generators. Specifically, the test pattern generated by the first of the two separate test pattern generators is communicated to a first BUT while the test pattern generator by the second of the two test pattern generators is communicated to a second BUT. The outputs of the two BUTs are then communicated to one of the output response analyzers and the outputs of the two BUTs are then analyzed in order to produce a pass/fail indication. Specifically, the outputs are compared and the results of the plurality of the output response analyzers are combined utilizing an iterative comparator in order to produce a pass/fail indication.

It should be appreciated that the FPGA is configured, the BIST is initiated and the results are all read by operation of a test controller which may take the form of automatic test equipment (ATE), a central processing unit (CPU) or a maintenance processor. Typically, an ATE of the type known in the art is utilized for wafer/package testing. Typically, a CPU or maintenance processor of a type also well known in the art is utilized for board/system testing. More specifically, the test controller interacts with the FPGA to be tested to configure the FPGA logic. This is done by retrieving a BIST configuration from the configuration storage of the test controller and loading it into the FPGA.

Once the PLBs are fully configured in the two groups, the test controller initiates the BIST. The test strategy relies upon pseudoexhaustive testing. Accordingly, every subcircuit of the FPGA is tested with exhaustive patterns. This results in maximal fault coverage without the explicit fault model assumptions and fault simulations that must necessarily be developed with prior art testing approaches. Of course, many FPGAs contain RAM modules for which exhaustive testing is impractical. For these modules, the test controller utilizes standardized state of the art RAM test sequences which are known to be exhaustive for the fault models specific to RAMs.

Figure 1:
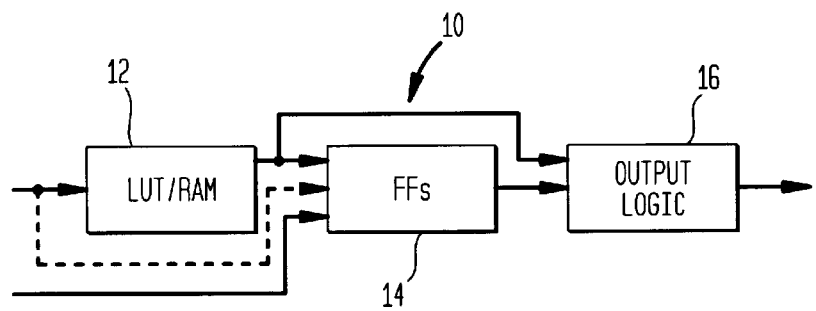
FIG. 1 is a schematical block diagram showing the structure of a typical programmable logic block (PLB) of a field programmable gate array (FPGA)

Reference is now made to FIG. 1 showing a PLB, generally designated by reference numeral 10. The PLB 10 comprises a memory block 12, a flip-flop block 14 and a combinational output logic block 16. Such a structure is, for example, featured in the Lucent ORCA programmable function unit, in the Xilinx XC4000 configurable logic block and the in ALTERA FLEX 8000 logic element. The memory block 12 may be configured as RAMs or combinational look-up tables (LUTs). The flip flops in the flip flop block 14 may also be configured as latches although other programming options dealing with synchronous and asynchronous Set and Reset, Clock Enable, etc. could be provided. Usually, the output block or cell 16 contains multiplexers (MUX) to connect different signal lines to the output of the PLB 10. Usually this cell has no feed back loops and the flip flops can be directly accessed by-passing the LUT (as shown by the dashed line in drawing FIG. 1). Advantageously, the inputs and outputs of every subcircuit in this type of simple structure are easy to control and observe. This simplifies the pseudoexhaustive testing of the cell.

Advantageously, the present testing method is particularly adapted to perform output response analysis by means of comparison with the expected response. Such an approach is difficult to utilize in most prior art BIST applications because of the expense involved in storing the reference response or in generating it from a copy of the circuit under test. In accordance with the present method, however, the circuits under test are identical PLBs 10 and all that is needed is to create the output response analyzers to compare their outputs.

Unlike signature-based compression circuits used in most other BIST applications, comparator-based output response analyzers do not suffer from the aliasing problem that occurs when some faulty circuits produce the good circuit signature. Essentially, as long as the BUTs being compared by the same output response analyzer do not fail in the same way at the same time, no aliasing is encountered with the comparison-based approach of the present invention. Problems caused by faults in test pattern generators are avoided in the present invention by having different test pattern generators feed the BUTs being compared by the same output response analyzer. Of course, all test pattern generators must be synchronized to generate the same test pattern at the same time.

Figure 2:
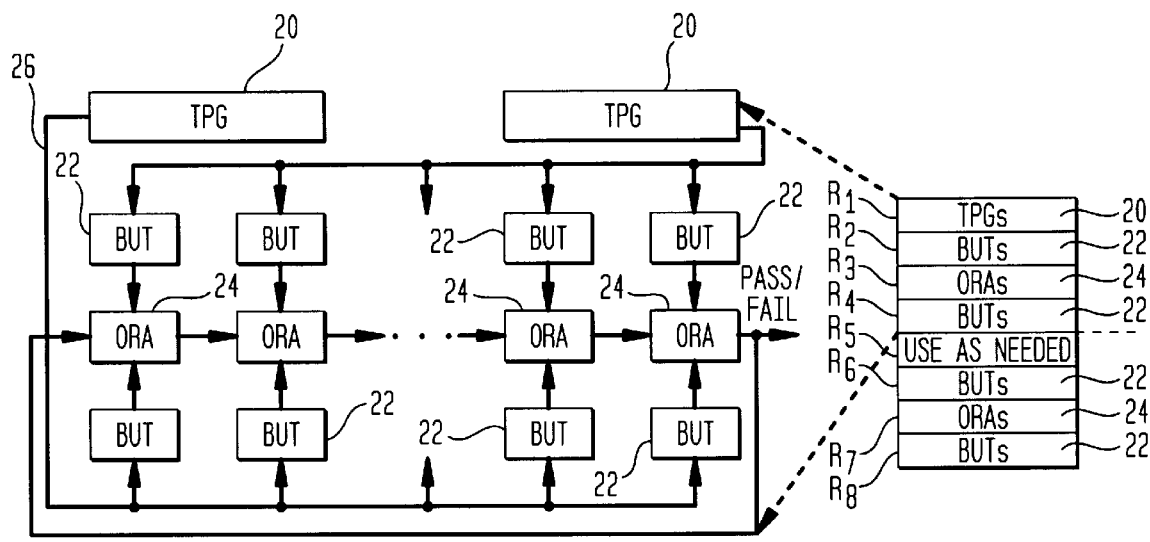
FIG. 2 is a schematical block diagram showing a floor plan of an 8×8 FPGA and its structure as temporarily programmed for purposes of diagnostic testing in accordance with the method of the present invention.

An important goal of the testing strategy is to minimize the number of test sessions and thereby minimize the testing time and effectively reduce testing costs. An FPGA configured for a test session in accordance with the method of the present invention is illustrated in FIG. 2. For purposes of this illustration, an 8×8 FPGA is shown. It should be appreciated, however, that the principles of the present invention are equally applicable to any N×N FPGA.

The floor plan for the first test session involves establishing the PLBs 10 in the first roll $R_1$ as test pattern generators 20. The test pattern generators 20 work as binary counters in order to supply exhaustive test patterns to the m-input blocks under test in most of the test configurations. Since each PLB 10 has more inputs than outputs, several PLBs are required to construct a single m-Bit counter. Of course, when the memory block 12 is configured as RAM, the test pattern generators 20 work as p-bit state machines wherein p>m in order to generate standard RAM test sequences. Importantly, two individual test pattern generators 20 are provided from the PLBs 10 forming the first row $R_1$. The second, fourth, sixth and eighth rows $R_2$, $R_4$, $R_6$ and $R_8$ of PLBs 10 are established as blocks under test 22 (BUTs). In accordance with the present method, each block under test 22 (BUT) is repeatedly reconfigured in order to test it in all modes of operation.

The third and seventh rows of PLBs in each FPGA being tested are initially configured or established as output response analyzers 24. As shown, each output response analyzer 24 compares two blocks under test 22 that receive test patterns from different test pattern generators 20 (note lead lines 26 and 28 from the test pattern generators). This approach eliminates any aliasing problem that might otherwise occur when some faulty circuits produce good circuit signatures. This approach also allows one to identify faults in the PLBs 10 forming the test pattern generators 20.

Figure 3:
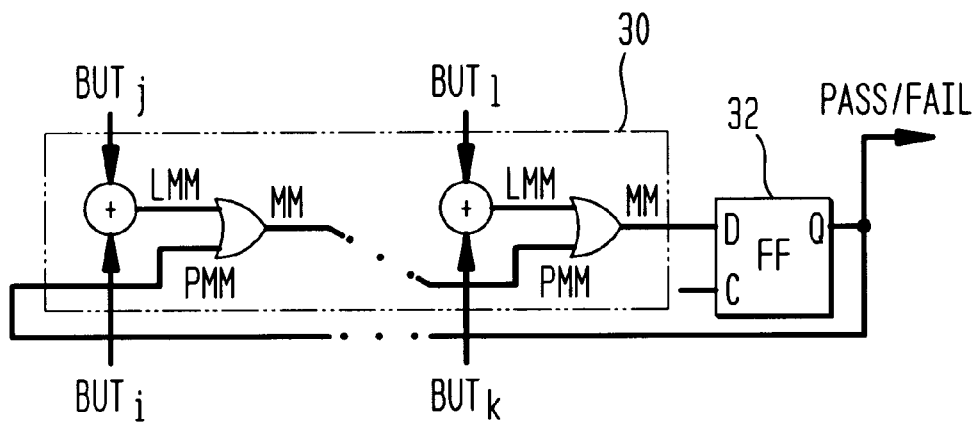
FIG. 3 is a schematical illustration of an iterative comparator with error locking as utilized in the present invention to combine the results of several output response analyzers.

In order to combine results of several output response analyzers 24 an iterative comparator 30 is utilized. In particular, an iterative comparator 30 based upon one proposed by Sridhar and Hayes in "Design of Easily Testable BIT-Sliced Systems", *IEEE Trans. on Computers,* Vol. C-30, No. 11, pp. 842–54, November, 1981. Such an iterative comparator 30 is shown in the dashed lines in FIG. 3. In this application, each output response analyzer 24 compares corresponding outputs from 2 BUTs 22 to produce a local mismatch signal (LMN) which is ORed with the previous mismatch signal (PMN) from the previous output response analyzer to generate the output response analyzer mismatch (MM). The flip-flop 32 is used to record the first mismatch encountered during the BIST sequence. The feedback from the flip flop output to the first output response analyzer 24 disables further comparisons after the first error is recorded. Except for this feedback signal, all the other output response analyzers signals propagate like in an iterative logic array, using only local routing resources.

While the test patterns from the test pattern generators 20 feed all BUTs 22 in parallel, the global routing that is utilized is easily scalable because the usage of global routing resources required for distributing the test patterns does not change with the size of the FPGA. Also, since each output response analyzer 24 compares the outputs of its two neighbor BUTs 22 all signals from the BUTs 22 to the output response analyzer can use local routing resources. Thus, this regular structure allows the architecture of the present invention to be constructed and interconnected algorithmetically as a function of the size (N) of the FPGA.

In accordance with the present method as set forth and shown in FIG. 2, the fifth row $R_5$ of the PLBs 10 is extra and may be used as needed or desired for fan out drivers, additional test pattern generators 20, additional output response analyzers 24 or left unused.

Figure 4A:
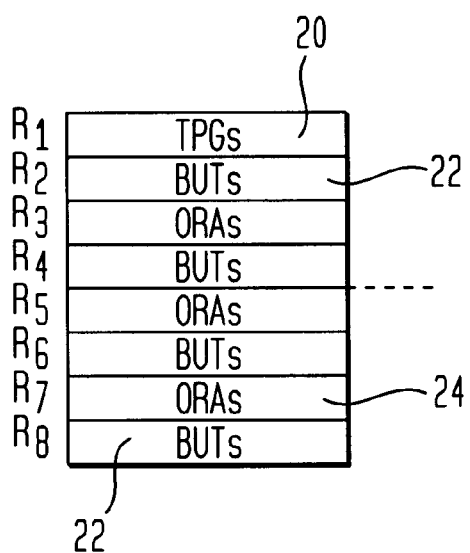
FIGS. 4a and 4b are schematical block diagrams showing the floor plans for two test sessions utilized to completely test every programmable logic block in an 8×8 FPGA.
Figure 4B:
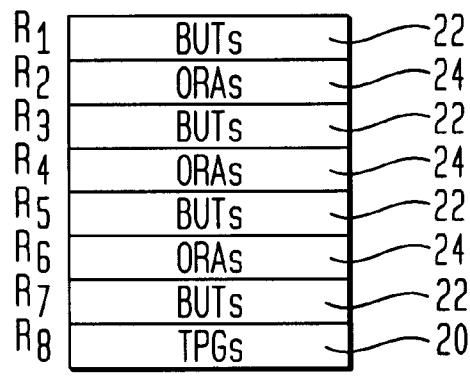

FIGS. 4a–4b illustrate the floor plans for the first two test sessions which allow one to completely test every PLB 10 in an 8×8 FPGA. In the first test session shown in FIG. 4a, the direction of the flow of test patterns is top to bottom and the extra PLBs in row $R_5$ are utilized as extra output response analyzers. The floor plan for the second test session shown in FIG. 4b is obtained by flipping the floor plan for the test session shown in FIG. 4a around the horizontal axis shown as a horizontal line between rows $R_4$, $R_5$ in the middle of the array. An important feature of the this architecture is that any FPGA may be completely tested in only two test sessions. This is a significant improvement over the iterative logic array based approach disclosed in U.S. Pat. No. 6,003,150, entitled "Method for Testing Field Programmable Gate Arrays" which required three test sessions. Thus, substantial test time savings result.

It should be appreciated that a faulty PLB 10 in a test pattern generator 20 or an output response analyzer 24 may not produce an error if the fault does not effect the operation of the test pattern generator or the output response analyzer. In this situation, a fault in that PLB 10 is only detected in the session when the PLB is configured as a BUT 22. In the architecture of the present invention, all BUTs 22 (except those in the first and last row of BUTs) are compared by two different output response analyzers 24. As a result, a fault in one of the middle rows of BUTs 22 produces errors at two output response analyzer 24 while faults in the first or last row of BUTs 22 produces an error in only one output response analyzer. Thus, a defective BUT 22 in row $R_4$ will cause errors at the adjacent output response analyzers 24 in rows $R_3$ and $R_5$ in the first test session illustrated in FIG. 4a. This is because the outputs of the BUT 22 are compared by the output response analyzers in those two rows. In contrast, a defective BUT 22 in row $R_1$ is detected only at the adjacent output response analyzer in row $R_2$ in the second test session shown in FIG. 4b. The results of the two test session analysis for an 8×8 FPGA are presented in Table 1 below under the heading "Without ORA/TPG Failures". The two test sessions are called NS and SN to suggest the direction of the flow of the test patterns. The outputs of the output response analyzers rows $R_3$, $R_5$ and $R_7$ used in the first test session NS are denoted by $O_3$, $O_5$ and $O_7$, and the outputs of the output response analyzers rows $R_2$, $R_4$ and $R_6$ used in the second test session SN are denoted by $O_2$, $O_4$ and $O_6$, respectively. Errors at the output response analyzer outputs are marked by X. It should be appreciated that one can readily observe that the error pattern of every faulty row is unique.

TABLE 1

Errors during BIST for a Single Faulty Row PLBs Without ORA/TPG Failures

| Faulty Row | Function Session NS | Function Session SN | Session NS | | | Session SN | | |
|---|---|---|---|---|---|---|---|---|
| | | | O3 | O5 | O7 | O2 | O4 | O6 |
| 1 | TPG | BUT | | | | X | | |
| 2 | BUT | ORA | X | | | | | |
| 3 | ORA | BUT | | | | X | X | |
| 4 | BUT | ORA | X | X | | | | |
| 5 | ORA | BUT | | | | | X | X |
| 6 | BUT | ORA | | X | X | | | |
| 7 | ORA | BUT | | | | | | X |
| 8 | BUT | TPG | | | | X | | |

With ORA/TPG Failures

| Faulty Row | Function Session NS | Function Session SN | Session NS | | | Session SN | | |
|---|---|---|---|---|---|---|---|---|
| | | | O3 | O5 | O7 | O2 | O4 | O6 |
| 1 | TPG | BUT | (X | X | X) | X | | |
| 2 | BUT | ORA | X | | | (X) | | |
| 3 | ORA | BUT | (X) | | | X | X | |
| 4 | BUT | ORA | X | X | | (X) | | |
| 5 | ORA | BUT | | (X) | | | X | X |
| 6 | BUT | ORA | | X | X | | | (X) |
| 7 | ORA | BUT | | (X) | | | | X |
| 8 | BUT | TPG | | | X | (X | X | X) |

In certain situations, some faults in a PLB 10 may be detected when that PLB is configured as an output response analyzer 24 or a test pattern generator 20. The results of such an analysis are presented in Table 1 under the heading "With ORA/TPG Failures". A fault in an output response analyzer 24 may cause an error only in that output response analyzer when it reports a mismatch although all compared pairs of output values agree. Thus, in addition to the error at the output response analyzer in row $R_3$ during the first test session shown in FIG. 4a, a fault in a PLB 10 in row $R_2$ may also cause an error at the output response analyzer in row $R_2$ in the second test session as shown in FIG. 4b. This error is marked by "(X)" to denote a potential error. A fault in a test pattern generator row may cause the two test pattern generators to produce different patterns, thus generating mismatches in every comparator and resulting in errors at all output response analyzer outputs in that session: accordingly, in rows 1 and 8, we use "(XXX)" to denote a potential group of three errors. It should be appreciated that the pattern of every faulty row is unique and, accordingly, only two BIST sessions as described are necessary to accurately locate the row in which the faulty PLB 10 resides.

Figure 5A:
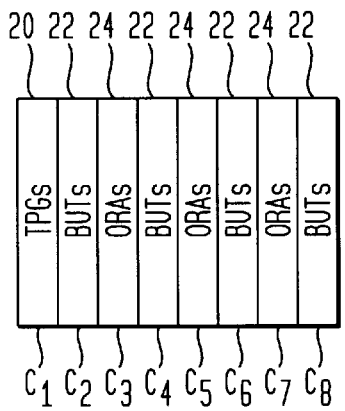
FIGS. 5a and 5b are schematical block diagrams showing the floor plans reorientated 90° to provide two additional "diagnostic" test sessions and enabling one to specifically identify any individual faulty programmable logic block.
Figure 5B:
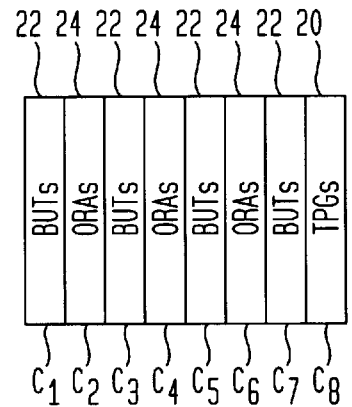

The specific faulty PLB in a particular row R may be identified by further diagnostic testing. Specifically, as shown in FIGS. 5a and 5b, the testing process may be repeated after rotating the test sessions by 90° so that the flow of test patterns is horizontal along rows instead of vertical along columns. This new arrangement allows one to identify a faulty column instead of a faulty row, then the faulty BUT 10 is located at the intersection of the faulty row with the faulty column.

More specifically, in the first test session, column $C_1$ is configured as test pattern generators 20 while columns $C_3$ and $C_7$ are configured as output response analyzers 24. Additionally, in the illustration, the extra column $C_5$ is also configured as output response analyzers 24 although as discussed above, the PLBs in this column could be utilized as fan out drivers, additional test pattern generators or even left unused. The remaining columns in the first text session, columns $C_2$, $C_4$, $C_6$ and $C_8$ are configured as BUTs 22. After completion of exhaustive testing of each BUT 22, in this first diagnostic test session shown in FIG. 5a, the floor plan is flipped around the vertical axis shown as the line between columns $C_4$ and $C_5$ at the middle of the array. Now each column previously configured as a test pattern generator 20 or an output response analyzer 24 is configured as a BUT 22 (i.e. the functional roles of the PLBs is exchanged or reversed). Thus, columns $C_1$, $C_3$, $C_5$ and $C_7$ are configured as BUTs 22 while the PLBs in column $C_8$ are configured as test pattern generators 20 and the PLBs in columns $C_2$ and $C_6$ are configured as output response analyzers 24. Again, the "extra" PLBs 10 in column $C_4$ are also shown as being configured as output response analyzers 24 although these may serve other purposes as indicated above.

Of course, it should be appreciated that Table 1 shows only the failing sessions while the errors are actually recorded during a specific phase of each session. Thus, it is possible to significantly shorten the length of the diagnostic session by utilizing adaptive diagnosis strategy wherein subsequent tests are applied based upon the results obtained so far. In this way, it is possible to achieve full resolution in many instances without completing both additional horizontal test sessions as shown in FIGS. 5a and 5b. In some cases, it will even be possible to identify the individual faulty PLB 10 after the first diagnostic test phase shown in FIG. 5a without having to run the second diagnostic test phase shown in FIG. 5b. In the worst case, however, both diagnostic test phases will need to be performed.

Of course, diagnosis of multiple faulty PLBs 10 is also possible. A review of Table 1 makes it clear that multiple PLBs in the same row or column are easily identified. Another large class of multiple faulty PLBs 10 that may be precisely diagnosed are PLBs in rows or columns that are observed by disjoint sets of output response analyzers 24. For example, faults in row 7 may be detected only at O6 and O7 while faults in row 2 may be detected at only O2 and O3. Accordingly, any combination of faulty PLBs 10 in rows 2 and 7 may be diagnosed. This class of multiple faulty PLBs 10 is large since in an N×N array of PLBs there will be N/2−1 output response analyzer output signals and faults in row i can be observed at O(i−1) and O(i+1) for i=3, 4, . . . N−2 when i is a row of BUTs 22 and potentially at Oi when i is a row of output response analyzers 24.

Most combinations of faulty rows that affect overlapping sets of output response analyzers 24 can also be diagnosed. Let {i, j, . . . } denote a set of faulty rows. For example, it may be shown that {2,4} and {4}, which have O3 as a common output response analyzer output, may never have the same pattern of errors. If the faults in rows 2 and 4 do not cause errors at O3 in exactly the same BIST phases, then {2,4} and {4} can be distinguished at O3. If the faults in rows 2 and 4 affect corresponding BUTs 22 (that are compared by the same ORA), and they always have the same responses, then {2,4} will not have any errors at O3 while {4} will. Although there exist some multiple faulty PLBs 10 that cannot be accurately diagnosed, it appears that the corresponding fault situations are very unlikely to occur in practice. For example, assume that faulty output response analyzers 24 and test pattern generators 20 do not produce failures, and consider {4, 6} and {2, 8}; their error patterns would be identical only if the following conditions occur simultaneously: 1) the faults in rows 4 and 6 affect corresponding BUTs which always have the same responses (this would eliminate the errors at O5); 2) faults in rows 2 and 4 cause errors at O3 in exactly the same BIST phases; 3) faults in rows 6 and 8 cause errors at O7 in exactly the same BIST phases. Similar analyses show that in general, the BIST architecture of the present invention imposes very restrictive conditions necessary for multiple faulty PLBs 10 to produce identical error patterns.

Although a single test pattern generator 20 is sufficient for completely testing all PLBs 10, we can obtain better diagnostic resolution by having two different (but synchronized) test pattern generators 20 feed the BUTs 22 being compared by the same output response analyzer 24. Otherwise, a defective single test pattern generator 20 may not supply the patterns needed to detect a fault in a BUT 22, but this will not cause any mismatch because all BUTs 22 still receive the same patterns. With two separate test pattern generators 20, a fault affecting one test pattern generator will cause an error at every output response analyzer 24, since half of the BUTs 22 will receive test patterns from the faulty test pattern generator.

EXAMPLE 1

The present BIST-based diagnostic approach was utilized in the testing and diagnosis of known defective ORCA FPGAs. The test consisted of 14 phases, summarized in Table 2 in terms of the modes of operation of the look-up tables (LUTs) and flip-flop/latch circuits of the PLB 10 tested during every test phase. The first 9 BIST phases are used to test all ORCA series FPGAs, while the last 5 BIST phases are added to test the 2CA series (see *Field Programmable Gate Arrays Data Book,* Lucent Technologies, October 1996). The number of PLB outputs for each BIST phase is shown in the last column.

TABLE 2

Summary of BIST Phases for BUTs
Flip-Flop/Latch Modes & Options

| Phase No. | FF/ Latch | Set/ Reset | Clock | Clk Enable | Flip-Flop Data In | LUT Mode | No. Outs |
|---|---|---|---|---|---|---|---|
| 1 | — | — | — | — | — | Async. RAM | 4 |
| 2 | — | — | — | — | — | Adder/ subtractor | 5 |
| 3 | — | — | — | — | — | 5-variable MUX | 4 |
| 4 | — | — | — | — | — | 5-variable XOR | 4 |
| 5 | Flip-Flop | Async. Reset | Falling Edge | Active Low | LUT Output | Count Up | 5 |
| 6 | Flip-Flop | Async. Reset | Falling Edge | Enabled | PLB Input | Count Up/ Down | 5 |
| 7 | Latch | Sync. Set | Active Low | Active High | LUT Output | Count Down | 5 |
| 8 | Flip-Flop | Sync. Reset | Rising Edge | Active Low | PLB Input | 4-variable | 4 |
| 9 | Latch | — | Active High | Active Low | Dynamic Select | 4-variable | 4 |
| 10 | — | — | — | — | — | Multiplier | 5 |
| 11 | — | — | — | — | — | Greater/ Equal to Comp | 5 |
| 12 | — | — | — | — | — | Not Equal to Comp | 5 |
| 13 | — | — | — | — | — | Synchronous RAM | 4 |
| 14 | — | — | — | — | — | Dual Port RAM | 4 |

Figure 6A:
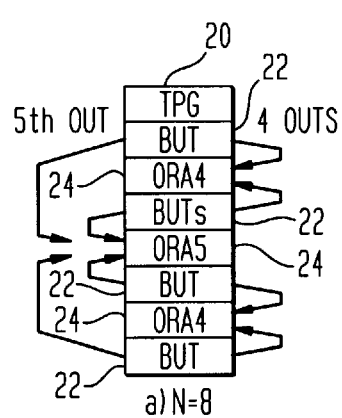
FIGS. 6a–6d are schematical block diagrams illustrating the application of the present built-in self-test method to an ORCA FPGA.
Figure 6B:
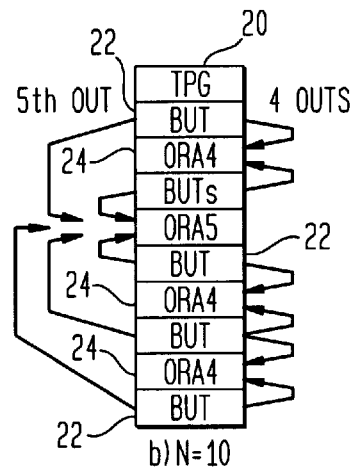
Figure 6C:
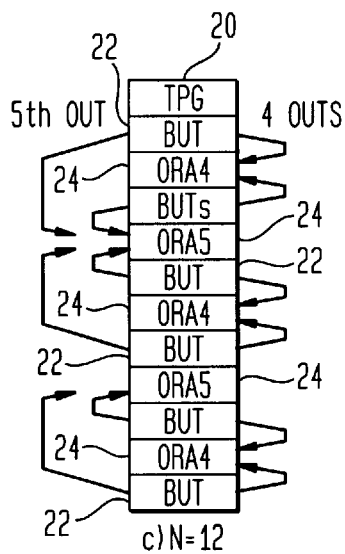
Figure 6D:
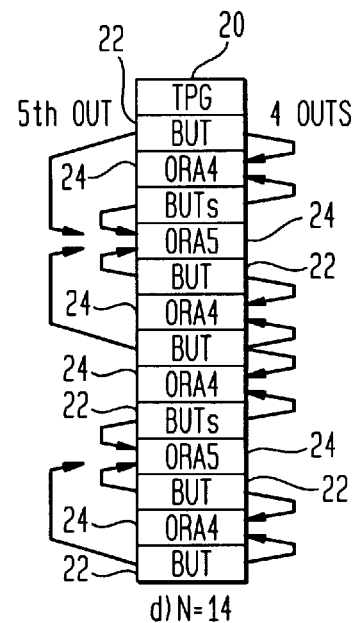

The ORCA PLB 10 has five outputs used in many of its modes of operation as a BUT 22, while only four pairs of outputs can be compared by a single PLB configured as an output response analyzer 24. As a result, during the BIST test sessions, the "used as needed" or "extra" row is used to compare the fifth output from up to eight rows of BUTs 22 in those configurations which use all five outputs. The grouping of BUTs 22 and output response analyzers 24 with respect to the normal four outputs and the extra fifth output is a function of the size of the FPGA as illustrated in FIGS. 6a–6d. The minimum array size for most FPGAs is N=8, in which case the "used as needed" row is used to compare the fifth output from four BUTs 22. As N increases, the groups of four outputs from adjacent BUTs are compared pairwise by the rows labeled ORA4, while the fifth outputs are grouped and compared by the rows labeled ORA5. For N=16, the basic configuration of FIG. 6a can be used twice, either with two sets of test pattern generators 20 to reduce loading on the test pattern generator outputs, or with an ORA4 in place of the second set of test pattern generators. For 16<N<32, combinations of the arrangements shown in FIG. 7 can be used until the arrangement in FIG. 6a is replicated three times for N=32. For the second test session, the connection arrangement is rotated about the points indicated in FIGS. 6a–6d, so that every row of PLBs 10 are BUTs 22 in one test session.

Next it is necessary to consider the BIST phases in which all five outputs of the PLB 10 are tested. As a result of the regular BIST sequence, it was determined which phase or phases fail, as well as whether the error was at one of the four outputs or at the fifth output. At that point four diagnostic test phases were run based on the failing output: either a diagnostic test phase for the four outputs or a diagnostic test phase for the fifth output with output response generators 24 comparing adjacent BUT outputs. Each of the four diagnostic test phases used a different PLB assignment with respect to rows and columns as illustrated in FIGS. 4a and 4b and FIGS. 5a and 5b (here, FIG. 4a and FIG. 4b represent diagnostic test phases rather than complete BIST sessions). From these results, it was possible to identify the faulty PLBs 10 in the FPGA in the same manner as was done in the case of the four output phases described above. As a result, at most four additional diagnostic test phases are required (as opposed to two additional diagnostic test phases in the case of the four output phases), for an increase in test time of about only 14%.

In addition to the 28 BIST configurations (14 for each test session), two diagnostic test phases were generated for each of the seven BIST phases which test the PLB 10 in operational modes which use only four outputs, for another 14 configurations. Eight diagnostic test phases were also generated for each of the seven BIST phases which test the PLB 10 in operational modes that use five outputs, for another 56 configurations. Four of the eight diagnostic test phases were used to diagnose the four PLB outputs in each of the four directions shown in FIGS. 4a, 4b, 5a and 5b, while the other four diagnostic test phases were used to diagnose the fifth PLB output in each of the four directions. As a result, a total of 98 configurations (28 BIST phases and 70 diagnostic test phases) were generated of which only 30 or 32 configurations were used to identify a single faulty PLB as a result of the adaptive diagnostic approach.

The device targeted for experimentation with this BIST-based diagnostic approach was the ORCA 2C15A which required the full set of 14 test phases for each test session to completely test all 400 PLBs in the 20×20 array. We were provided with five 2C15A devices by Lucent Technologies Microelectronics Group in Allentown, Pa. From manufacturing test results, three of these parts were known to be fault-free and two were known to be defective. Applying the complete BIST sequence (two test sessions of 14 phases each), the defective FPGAs were successfully identified. Then, using the diagnostic phases, the faulty PLB(s) in the two failing devices were identified. The block under test-output response analyzer interconnections for the 2C15A consisted of two sets of connections shown in FIG. 6b, but with the second set of test pattern generators 20 replaced by an ORA4 row. As a result, there were nine output response analyzer outputs for each test configuration of the 2C15A with the 5th and 15th rows comparing the fifth PLB outputs during the first BIST session, and the corresponding rows/columns used in the second BIST session and the subsequent diagnostic phases.

FIG. 7a summarizes the diagnosis results for the first faulty device. No errors were detected in session one NS and errors at O2 and O4 in phases 5 through 9 were detected in session two SN. These results indicate that row 3 is faulty, and that its faults are not detected when row 3 is an output response analyzer. Reapplying one of the faulty phases twice as diagnosis sessions, no errors were detected in session three WE illustrated in FIG. 5a, and errors at O17 and O19 were detected in session four EW. These results indicate that row 18 is faulty, and that its faults are not detected when row 18 is an output response analyzer. When the results of the BIST phases and diagnostic test phases are combined, a single faulty PLB is identified in row 3 and column 18 of the 20×20 array. From Table 2, it may also be inferred that the fault is probably located in the flip-flop/latch logic of the defective PLB, because all the failing phases (5 through 9) test this subcircuit. This is an example of how the present method may be utilized to locate a faulty module in a PLB whether that module is a LUT/RAM block, a flip-flop latch block or an output logic block.

For the second faulty device, whose results are summarized in FIG. 7b, errors were detected at O15 and O17 in phases 1 and 6 of the first session NS and no errors were detected in the second session SN. During the corresponding diagnostic test phases, errors were obtained at O14, O16, and O18 in the third session WE and no errors were obtained in the fourth session EW. This combined set of error patterns identifies two faulty PLBs: one in row 5 and column 15 and the other in row 5 and column 17.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of testing a field programmable gate array including a plurality of programmable logic blocks, comprising steps of:
   configuring a first group of said programmable logic blocks to include at least one test pattern generator and at least two output response analyzers;
   designating a second group of said programmable logic blocks, said second group including a plurality of blocks under test;
   generating test patterns with said test pattern generators;
   comparing outputs of two of said blocks under test with one of said output response analyzers; and
   combining results of a plurality of said output response analyzers utilizing an iterative comparator in order to produce a pass/fail indication.

2. The method set forth in claim 1, including repeatedly reconfiguring each of said blocks under test in order to test each of said blocks under test completely in all possible modes of operation.

3. The method set forth in claim 2, including exchanging functional roles of said first and second groups of said programmable logic blocks so that said first group of said programmable logic blocks is designated as a plurality of blocks under test and said second group of programmable logic blocks is configured as at least one test pattern generator and at least two output response analyzers.

4. The method set forth in claim 3, including repeatedly reconfiguring each of said blocks under test in order to test each of said blocks under test completely in all possible modes of operation.

5. A method of testing a field programmable gate array including a plurality of programmable logic blocks, comprising steps of:

configuring said programmable logic blocks for completing a built-in self-test by establishing a first group of said programmable logic blocks as at least two separate test pattern generators and at least two output response analyzers and establishing a second group of said programmable logic blocks as a plurality of blocks under test;

generating test patterns with said two separate test pattern generators;

communicating said test patterns generated by a first of said two separate test pattern generators to a first group of blocks under test;

communicating said test patterns generated by a second of said two separate test pattern generators to a second group of blocks under test;

communicating outputs from said first and second groups of blocks under test to one of said output response analyzers; and analyzing said outputs from said blocks under test in order to produce a pass/fail indication.

6. The method set forth in claim 5, including repeatedly reconfiguring each of said blocks under test in order to test each of said blocks under test completely in all possible modes of operation.

7. The method set forth in claim 5, including exchanging functional roles of said first and second groups of said programmable logic blocks so that said first group of said programmable logic blocks is established as a plurality of blocks under test and said second group of programmable logic blocks is established as at least two separate test pattern generators and at least two output response analyzers.

8. The method set forth in claim 7, including repeatedly reconfiguring each of said blocks under test in order to test each of said blocks under test completely in all possible modes of operation.

9. The method set forth in claim 5, wherein said analyzing is performed by iterative comparing of said outputs from said first and second groups of blocks under test.

10. A method of testing a field programmable gate array including a plurality of programmable logic blocks, comprising steps of:

selectively configuring ones of said field programmable logic blocks as test pattern generators, output response analyzers and blocks under test for completion of a built-in self-test;

communicating test patterns generated by said test pattern generators to said blocks under test by global routing;

communicating outputs from said blocks under test to said output response analyzers by local routing; and analyzing said outputs by iterative comparison in order to produce a pass/fail indication.

11. A method of testing an N×N field programmable gate array including a plurality of programmable logic blocks in N rows and N columns, comprising steps of:

configuring a first group of rows of said programmable logic blocks as at least one test pattern generator and at least two output response analyzers;

establishing a second group of rows of said programmable logic blocks as a plurality of blocks under test;

generating test patterns with said test pattern generators;

comparing, outputs of said blocks under test with said output response analyzers and using the failing test results to identify a faulty row or a plurality of faulty rows;

exchanging functional roles of said rows of programmable logic blocks;

configuring a third group of columns of said programmable logic blocks as at least one test pattern generator and at least two output response analyzers;

establishing a fourth group of columns of said programmable logic blocks as a plurality of blocks under test;

generating test patterns with said test pattern generators;

comparing outputs of said blocks under test with said output response analyzers; and exchanging functional roles of said columns of programmable logic blocks and using the failing test results to identify a faulty column or a plurality of faulty columns; and combining the identified faulty row or rows with the identified faulty column or columns to identify a faulty programmable logic block or blocks.

12. The method set forth in claim 11, including repeatedly reconfiguring each of said blocks under test in order to test each of said blocks under test completely in all possible modes of operation.

13. A field programmable gate array configured to comprise:

a test pattern generator;

at least two output response analyzers;

a plurality of blocks under test; and an iterative comparator for comparing outputs of two of said blocks under test with each of said output response analyzers and combining results of said output response analyzers in order to produce a pass/fail indication.

14. The field programmable gate array configuration set forth in claim 13, further including a memory for storing test patterns and configurations to provide exhaustive testing of each block under test.

15. The field programmable gate array configuration set forth in claim 13, having a substantial absence of dedicated circuitry for built-in self-testing applications.

* * * * *